US012426438B2

(12) United States Patent
Zhang

(10) Patent No.: US 12,426,438 B2
(45) Date of Patent: Sep. 23, 2025

(54) QUANTUM DOTS LIGHT EMITTING DIODE, DISPLAY APPARATUS, AND METHOD OF FABRICATING QUANTUM DOTS LIGHT EMITTING DIODE

(71) Applicants: Beijing BOE Technology Development Co., Ltd., Beijing (CN); BOE Technology Group Co., Ltd., Beijing (CN)

(72) Inventor: Aidi Zhang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 1434 days.

(21) Appl. No.: 16/975,115

(22) PCT Filed: Nov. 14, 2019

(86) PCT No.: PCT/CN2019/118485
§ 371 (c)(1),
(2) Date: Aug. 21, 2020

(87) PCT Pub. No.: WO2021/092850
PCT Pub. Date: May 20, 2021

(65) Prior Publication Data
US 2023/0157049 A1    May 18, 2023

(51) Int. Cl.
*H10K 50/16* (2023.01)
*C09K 11/56* (2006.01)
(Continued)

(52) U.S. Cl.
CPC ............ *H10K 50/16* (2023.02); *C09K 11/565* (2013.01); *H10K 50/115* (2023.02); *H10K 71/40* (2023.02); *H10K 2101/80* (2023.02)

(58) Field of Classification Search
CPC ...... H10K 50/115; H10K 50/16; H10K 50/10; H10K 50/11; H10K 2102/00; H10K 59/10;
(Continued)

(56) References Cited

U.S. PATENT DOCUMENTS

2009/0039764 A1    2/2009  Cho et al.
2012/0138894 A1    6/2012  Qian et al.
(Continued)

FOREIGN PATENT DOCUMENTS

CN    106409995 A    2/2017
CN    106654026 A    5/2017
(Continued)

OTHER PUBLICATIONS

First Office Action in the Chinese Patent Application No. 201980002429.5, dated Nov. 22, 2021; English translation attached.
(Continued)

*Primary Examiner* — Julio J Maldonado
*Assistant Examiner* — Stanetta D Isaac
(74) *Attorney, Agent, or Firm* — Intellectual Valley Law, P.C.

(57) ABSTRACT

A quantum dots light emitting diode is provided. The quantum dots light emitting diode includes a first electrode layer; an electron transport layer on the first electrode layer; and a quantum dots layer on a side of the electron transport layer away from the first electrode layer. The electron transport layer includes a gradient alloy composite sub-layer including an electron transport oxide material and an electron transport non-oxide chalcogen-containing material. The non-oxide chalcogen is selected from a group consisting of sulfide ion, selenium ion, and tellurium ion. The electron transport non-oxide chalcogen-containing material has a gradient distribution such that a content of the electron
(Continued)

transport non-oxide chalcogen-containing material decreases along a direction from the quantum dots layer to the first electrode layer.

14 Claims, 6 Drawing Sheets

(51) Int. Cl.
*H10K 50/115* (2023.01)
*H10K 71/40* (2023.01)
*H10K 101/00* (2023.01)

(58) Field of Classification Search
CPC .... H10K 2101/80; H10K 71/40; H10K 71/00; C09K 11/00–605; C09K 11/611–613; C09K 11/621–625; C09K 11/64–643; C09K 11/671–673; C09K 11/873–886
See application file for complete search history.

(56) References Cited

U.S. PATENT DOCUMENTS

| | | |
|---|---|---|
| 2015/0021558 A1 | 1/2015 | Lee et al. |
| 2017/0186985 A1 | 6/2017 | Kim et al. |
| 2019/0115507 A1* | 4/2019 | Kim ............... H10K 50/82 |
| 2019/0276734 A1* | 9/2019 | Kim ............... C09K 11/883 |
| 2019/0296255 A1* | 9/2019 | Kim ............... H10K 71/00 |

FOREIGN PATENT DOCUMENTS

| | | |
|---|---|---|
| CN | 108039412 A | 5/2018 |
| KR | 20150080406 A | 7/2015 |

OTHER PUBLICATIONS

International Search Report & Written Opinion mailed Aug. 12, 2020, regarding PCT/CN2019/118485.
Qian et al., "Stable and efficient quantum-dot light-emitting diodes based on solution-processed multilayer structures", Nature Photonics, vol. 5, 543-548, Sep. 2011.
Song et al., "Efficient and Environmentally Stable Perovskite Solar Cells Based on ZnO Electron Collection Layer", Chem. Lett., 2015, 44, 610-612.
Yang et al., "Origin of the Thermal Instability in CH3NH3PbI3 Thin Films Deposited on ZnO", Chem. Mater., 2015, 27, 4229-4236.
Lei et al., "Intrinsic Charge Carrier Dynamics and Device Stability of Perovskite/ZnO Mesostructured Solar Cells in moisture", Journal of Materials Chemistry A, 2016, 4, 5474-5481.
Mashford et al., "High-efficiency quantum-dot light-emitting devices with enhances charge injection", Nature Photonics, vol. 7, 407-412, May 2013.
Yang et al., "High-efficiency light-emitting devices based on quantum dots with tailored nanostructures", Nature Photonics, vol. 9, 259-266, Apr. 2015.
Dai et al., "Solution-processed, high-performance light-emitting diodes based on quantum dots", Nature, vol. 515, 96, Nov. 2014.

* cited by examiner

QUANTUM DOTS LIGHT EMITTING DIODE, DISPLAY APPARATUS, AND METHOD OF FABRICATING QUANTUM DOTS LIGHT EMITTING DIODE

CROSS-REFERENCE TO RELATED APPLICATION

This application is a national stage application under 35 U.S.C. § 371 of International Application No. PCT/CN2019/118485, filed Nov. 14, 2019, the contents of which are incorporated by reference in the entirety.

TECHNICAL FIELD

The present invention relates to display technology, more particularly, to a quantum dots light emitting diode, a display apparatus, and a method of fabricating a quantum dots light emitting diode.

BACKGROUND

Quantum dots light emitting diodes typically include a light emitting layer having a plurality of quantum dots nanocrystals. The light emitting layer is sandwiched between an electron transport layer and a hole transport layer. An electric field is applied to the quantum dots light emitting diode, causing electrons and holes to move into the light emitting layer. In the light emitting layer, the electrons and holes are trapped in the quantum dots and recombine, emitting photons. The emission spectrum of a quantum dots light emitting diode is narrower as compared to organic light emitting diodes.

SUMMARY

In one aspect, the present invention provides a quantum dots light emitting diode, comprising a first electrode layer; an electron transport layer on the first electrode layer; a quantum dots layer on a side of the electron transport layer away from the first electrode layer; and an interface non-oxide chalcogen-containing compound at an interface between the electron transport layer and the quantum dots layer; wherein the electron transport layer comprises an electron transport non-oxide chalcogen-containing material; the interface non-oxide chalcogen-containing compound comprises a metal element from the quantum dots layer and a non-oxide chalcogen from the electron transport layer; and the non-oxide chalcogen is selected from a group consisting of sulfide ion, selenium ion, and tellurium ion.

Optionally, the electron transport layer comprises a gradient alloy composite sub-layer comprising an electron transport oxide material and the electron transport non-oxide chalcogen-containing material; and the electron transport non-oxide chalcogen-containing material has a gradient distribution such that a content of the electron transport non-oxide chalcogen-containing material decreases along a direction from the quantum dots layer to the first electrode layer.

Optionally, the electron transport oxide material has a gradient distribution such that a content of the electron transport oxide material decreases along a direction from the first electrode layer to the quantum dots layer.

Optionally, the electron transport oxide material and the electron transport non-oxide chalcogen-containing material comprise at least one metal element in common.

Optionally, the electron transport layer further comprises an electron transport non-oxide chalcogen-containing material sub-layer between the gradient alloy composite sub-layer and the quantum dots layer; wherein the electron transport non-oxide chalcogen-containing material sub-layer is substantially free of the electron transport oxide material.

Optionally, the interface non-oxide chalcogen-containing compound is at an interface between the electron transport non-oxide chalcogen-containing material sub-layer and the quantum dots layer.

Optionally, the electron transport non-oxide chalcogen-containing material sub-layer and a quantum dots material of a portion of the quantum dots layer most adjacent to the electron transport non-oxide chalcogen-containing material sub-layer comprise at least one metal element in common and at least one non-metal element in common.

Optionally, the electron transport layer further comprises an electron transport oxide material sub-layer between the first electrode layer and the gradient alloy composite sub-layer; wherein the electron transport oxide material sub-layer is substantially free of the electron transport non-oxide chalcogen-containing material.

Optionally, the quantum dots layer comprises a core and a shell; wherein the core comprises a material selected from the group consisting of CdS, CdSe, ZnSe, InP, CuInS, (Zn)CuInS, (Mn)CuInS, AgInS, (Zn)AgInS, CuInSe, CuInSeS, PbS, an organic inorganic perovskite material, an inorganic perovskite material, and any combination or alloy thereof; and the shell comprises a material selected from the group consisting of ZnS, ZnSeS, CdS, an organic inorganic perovskite material, an inorganic perovskite material, and any combination or alloy thereof.

Optionally, the electron transport oxide material is a material selected from the group consisting of zinc oxide, magnesium zinc oxide, aluminum zinc oxide, and magnesium aluminum zinc oxide.

Optionally, the electron transport non-oxide chalcogen-containing material is a material selected from the group consisting of zinc sulfide, magnesium zinc sulfide, aluminum zinc sulfide, and magnesium aluminum zinc sulfide.

Optionally, the gradient alloy composite sub-layer has a hexagonal crystal structure.

Optionally, gradient alloy composite sub-layer has a hexagonal crystal structure; and the electron transport non-oxide chalcogen-containing material sub-layer has a wurtzite crystal structure.

In another aspect, the present invention provides a quantum dots light emitting diode, comprising a first electrode layer; an electron transport layer on the first electrode layer; and a quantum dots layer on a side of the electron transport layer away from the first electrode layer; and wherein the electron transport layer comprises a gradient alloy composite sub-layer comprising an electron transport oxide material and an electron transport non-oxide chalcogen-containing material; the non-oxide chalcogen is selected from a group consisting of sulfide ion, selenium ion, and tellurium ion; and the electron transport non-oxide chalcogen-containing material has a gradient distribution such that a content of the electron transport non-oxide chalcogen-containing material decreases along a direction from the quantum dots layer to the first electrode layer.

Optionally, the electron transport oxide material has a gradient distribution such that a content of the electron transport oxide material decreases along a direction from the first electrode layer to the quantum dots layer.

Optionally, the electron transport oxide material and the electron transport non-oxide chalcogen-containing material comprise at least one metal element in common.

Optionally, the electron transport layer further comprises an electron transport non-oxide chalcogen-containing material sub-layer between the gradient alloy composite sub-layer and the quantum dots layer; wherein the electron transport non-oxide chalcogen-containing material sub-layer is substantially free of the electron transport oxide material.

Optionally, the quantum dots light emitting diode further comprises an interface non-oxide chalcogen-containing compound at an interface between the electron transport layer and the quantum dots layer; wherein the interface non-oxide chalcogen-containing compound comprises a metal element from the quantum dots layer and a non-oxide chalcogen from the electron transport layer.

Optionally, the interface non-oxide chalcogen-containing compound is at an interface between the electron transport non-oxide chalcogen-containing material sub-layer and the quantum dots layer.

Optionally, the electron transport non-oxide chalcogen-containing material sub-layer and a quantum dots material of a portion of the quantum dots layer most adjacent to the electron transport non-oxide chalcogen-containing material sub-layer comprise at least one metal element in common and at least one non-metal element in common.

Optionally, the electron transport layer further comprises an electron transport oxide material sub-layer between the first electrode layer and the gradient alloy composite sub-layer; wherein the electron transport oxide material sub-layer is substantially free of the electron transport non-oxide chalcogen-containing material.

Optionally, the quantum dots layer comprises a core and a shell; wherein the core comprises a material selected from the group consisting of CdS, CdSe, ZnSe, InP, CuInS, (Zn)CuInS, (Mn)CuInS, AgInS, (Zn)AgInS, CuInSe, CuInSeS, PbS, an organic inorganic perovskite material, an inorganic perovskite material, and any combination or alloy thereof; and the shell comprises a material selected from the group consisting of ZnS, ZnSeS, CdS, an organic inorganic perovskite material, an inorganic perovskite material, and any combination or alloy thereof.

Optionally, the electron transport oxide material is a material selected from the group consisting of zinc oxide, magnesium zinc oxide, aluminum zinc oxide, and magnesium aluminum zinc oxide.

Optionally, the electron transport non-oxide chalcogen-containing material is a material selected from the group consisting of zinc sulfide, magnesium zinc sulfide, aluminum zinc sulfide, and magnesium aluminum zinc sulfide.

Optionally, the gradient alloy composite sub-layer has a hexagonal crystal structure.

Optionally, gradient alloy composite sub-layer has a hexagonal crystal structure; and the electron transport non-oxide chalcogen-containing material sub-layer has a wurtzite crystal structure.

In another aspect, the present invention provides a method of fabricating a quantum dots light emitting diode, comprising providing a first electrode layer; forming an electron transport layer on the first electrode layer; and forming a quantum dots layer on a side of the electron transport layer away from the first electrode layer; wherein forming the electron transport layer comprises forming a gradient alloy composite sub-layer comprising an electron transport oxide material and an electron transport non-oxide chalcogen-containing material; the non-oxide chalcogen is selected from a group consisting of sulfide ion, selenium ion, and tellurium ion; and the electron transport non-oxide chalcogen-containing material has a gradient distribution such that a content of the electron transport non-oxide chalcogen-containing material decreases along a direction from the quantum dots layer to the first electrode layer.

Optionally, forming the gradient alloy composite sub-layer comprises forming an oxide material coating on the first electrode layer; exposing the oxide material coating to a chalcogenization reagent; and heating the oxide material coating during or subsequent to exposing the oxide material coating to the chalcogenization reagent, thereby forming the gradient alloy composite sub-layer.

Optionally, forming the gradient alloy composite sub-layer further comprises adjusting a degree of chalcogenization of the oxide material by adjusting one or a combination of a heating temperature and a heating duration when heating the oxide material coating.

Optionally, the method further comprises determining the degree of chalcogenization based on a light emission color of the quantum dots layer.

Optionally, forming the oxide material coating comprises coating a precursor solution on the first electrode layer, wherein the precursor solution comprises at least one metal element that the electron transport oxide material and the electron transport non-oxide chalcogen-containing material comprise in common; and heating the precursor solution on the first electrode layer in an oxygen-containing atmosphere, thereby oxidizing the precursor solution into the oxide material coating.

Optionally, the method further comprises forming an electron transport oxide material sub-layer between the first electrode layer and the gradient alloy composite sub-layer; and forming an electron transport non-oxide chalcogen-containing material sub-layer between the gradient alloy composite sub-layer and the quantum dots layer; wherein the electron transport oxide material sub-layer is substantially free of the electron transport non-oxide chalcogen-containing material; and the electron transport non-oxide chalcogen-containing material sub-layer is substantially free of the electron transport oxide material.

Optionally, forming the electron transport oxide material sub-layer, forming the electron transport non-oxide chalcogen-containing material sub-layer, and forming the gradient alloy composite sub-layer are performed in a same process during heating the oxide material coating.

Optionally, the method further comprises forming an interface non-oxide chalcogen-containing compound at an interface between the electron transport layer and the quantum dots layer; wherein the interface non-oxide chalcogen-containing compound comprises a metal element from the quantum dots layer and a non-oxide chalcogen from the electron transport layer.

Optionally, forming the quantum dots layer comprises coating a quantum dots solution on the electron transport layer; wherein, during forming the quantum dots layer, a metal element from the quantum dots solution reacts with the electron transport non-oxide chalcogen-containing material in the electron transport non-oxide chalcogen-containing material sub-layer, thereby forming the interface non-oxide chalcogen-containing compound at an interface between the electron transport non-oxide chalcogen-containing material sub-layer and the quantum dots layer.

Optionally, forming the quantum dots layer further comprises annealing the quantum dots solution coated on the electron transport layer at an annealing temperature lower than 200 degree Celsius; wherein, during annealing the quantum dots solution, the metal element from the quantum dots solution further reacts with the electron transport non-oxide chalcogen-containing material in the electron transport non-oxide chalcogen-containing material sub-layer, forming additional interface non-oxide chalcogen-containing compounds at an interface between the electron transport non-oxide chalcogen-containing material sub-layer and the quantum dots layer.

In another aspect, the present invention provides a display apparatus, comprising an array of the quantum dots light emitting diode described herein or fabricated by a method described herein, and a pixel driving circuit connected to the quantum dots light emitting diode; wherein the quantum dots light emitting diode further comprises a second electrode layer on a side of the quantum dots layer away from the first electrode layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
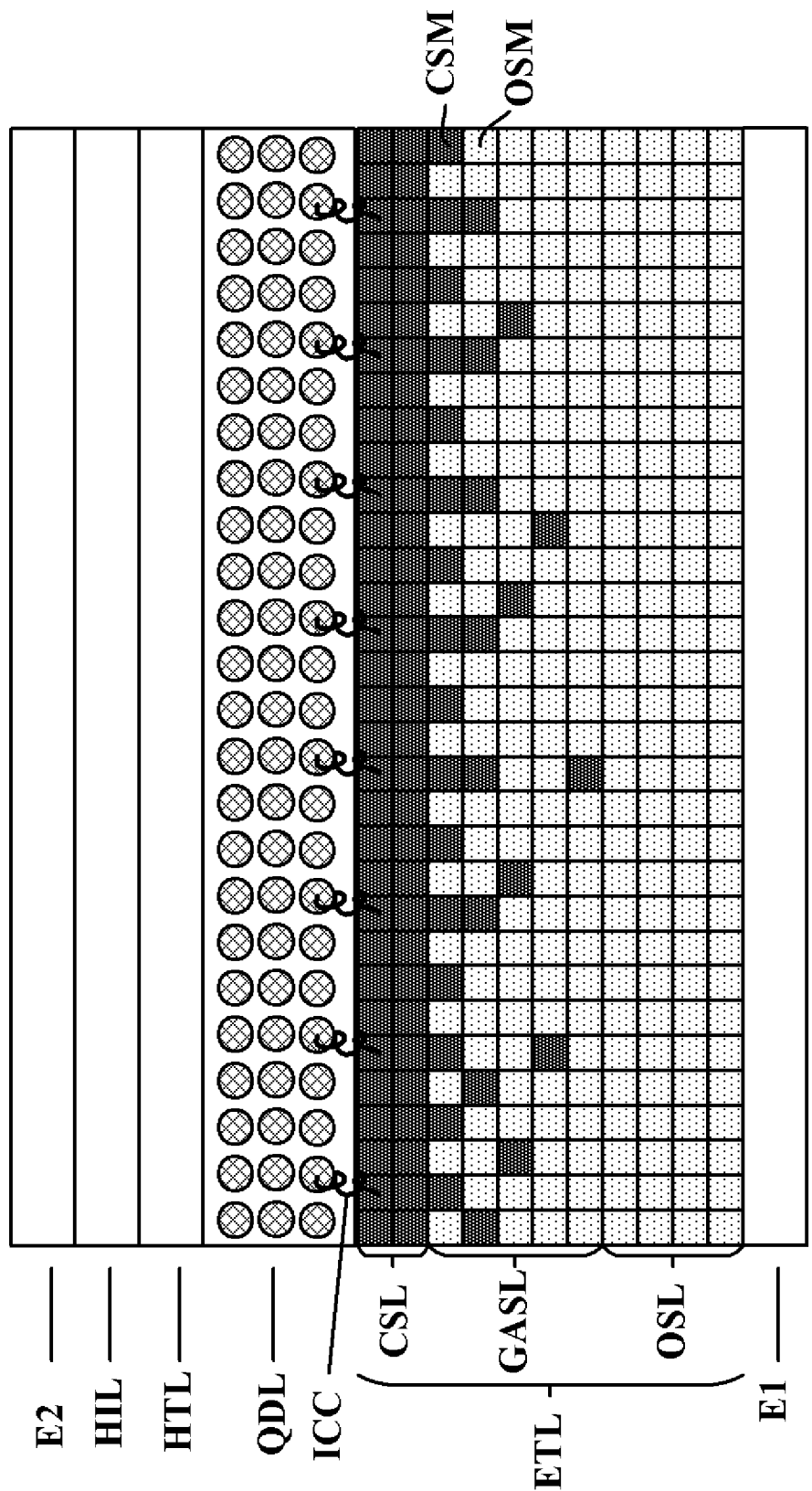
FIG. 1 is a schematic diagram of a quantum dots light emitting diode in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It is discovered in the present disclosure that, in a fabrication process of related quantum dots light emitting diodes, the hydroxyl group and oxygen vacancies on the surface of the hydrophilic zinc oxide layer will damage the surface ligands of the quantum dots, leading to fluorescence quenching of the quantum dots. Moreover, electron accumulation at the interface between the electron transport layer and the quantum dots layer further damages the functional layers of the device, severely affecting life-time of the device.

Accordingly, the present disclosure provides, inter alia, a quantum dots light emitting diode, a display apparatus, and a method of fabricating a quantum dots light emitting diode that substantially obviate one or more of the problems due to limitations and disadvantages of the related art. In one aspect, the present disclosure provides a quantum dots light emitting diode. In some embodiments, the quantum dots light emitting diode includes a first electrode layer; an electron transport layer on the first electrode layer; and a quantum dots layer on a side of the electron transport layer away from the first electrode layer. Optionally, the electron transport layer includes a gradient alloy composite sub-layer including an electron transport oxide material and an electron transport non-oxide chalcogen-containing material. Optionally, the non-oxide chalcogen is selected from a group consisting of sulfide ion, selenium ion, and tellurium ion. Optionally, the electron transport non-oxide chalcogen-containing material has a gradient distribution such that a content of the electron transport non-oxide chalcogen-containing material decreases along a direction from the quantum dots layer to the first electrode layer.

In some embodiments, the quantum dots light emitting diode includes a first electrode layer; an electron transport layer on the first electrode layer; a quantum dots layer on a side of the electron transport layer away from the first electrode layer; and an interface non-oxide chalcogen-containing compound at an interface between the electron transport layer and the quantum dots layer. Optionally, the electron transport layer includes an electron transport non-oxide chalcogen-containing material. Optionally, the interface non-oxide chalcogen-containing compound includes a metal element from the quantum dots layer and a non-oxide chalcogen from the electron transport layer. Optionally, the non-oxide chalcogen is selected from a group consisting of sulfide ion, selenium ion, and tellurium ion. Optionally, the electron transport layer comprises a gradient alloy composite sub-layer comprising an electron transport oxide material and the electron transport non-oxide chalcogen-containing material.

FIG. 1 is a schematic diagram of a quantum dots light emitting diode in some embodiments according to the present disclosure. Referring to FIG. 1, the quantum dots light emitting diode in some embodiments includes a first electrode layer E1, an electron transport layer ETL on the first electrode layer E1, and a quantum dots layer QDL on a side of the electron transport layer ETL away from the first electrode layer E1. In some embodiments, the electron transport layer ETL includes a gradient alloy composite sub-layer GASL. The gradient alloy composite sub-layer GASL includes an electron transport oxide material and an electron transport non-oxide chalcogen-containing material. Optionally, the non-oxide chalcogen is selected from a group consisting of sulfide ion, selenium ion, and tellurium ion, and the electron transport non-oxide chalcogen-containing material is selected from a group consisting of an electron transport sulfide material, an electron transport selenium-containing material, and an electron transport tellurium-containing material.

In some embodiments, the electron transport non-oxide chalcogen-containing material CSM in the gradient alloy composite sub-layer GASL has a gradient distribution such that a content (or a concentration) of the electron transport non-oxide chalcogen-containing material CSM decreases along a direction from the quantum dots layer QDL to the first electrode layer E1. Optionally, a content (or a concentration) of the electron transport non-oxide chalcogen-containing material CSM increases along a direction from the first electrode layer E1 to the quantum dots layer QDL. Optionally, the electron transport oxide material OSM in the gradient alloy composite sub-layer GASL has a gradient distribution such that a content (or a concentration) of the electron transport oxide material OSM decreases along a direction from the first electrode layer E1 to the quantum dots layer QDL. Optionally, a content (or a concentration) of the electron transport oxide material OSM increases along a direction from the quantum dots layer QDL to the first electrode layer E1. As used herein, the term "gradient distribution" of the electron transport non-oxide chalcogen-containing material means that the electron transport non-oxide chalcogen-containing material is enriched in a first region closer to the quantum dots layer QDL as compared to a second region closer to the first electrode layer E1. As used herein, the term "gradient distribution" of the electron transport oxide material means that the electron transport oxide material is enriched in the second region closer to the first electrode layer E1 as compared to the first region closer to the quantum dots layer QDL. As shown in FIG. 1, in the gradient alloy composite sub-layer GASL, the electron transport non-oxide chalcogen-containing material is enriched in a first region closer to the quantum dots layer QDL as compared to a second region closer to the first electrode layer E1, and the electron transport oxide material OSM is enriched in the second region closer to the first electrode layer E1 as compared to the first region closer to the quantum dots layer QDL.

In some embodiments, a content (or a concentration) of the electron transport non-oxide chalcogen-containing material CSM gradually decreases along a direction from the quantum dots layer QDL to the first electrode layer E1. Optionally, a content (or a concentration) of the electron transport non-oxide chalcogen-containing material CSM gradually increases along a direction from the first electrode layer E1 to the quantum dots layer QDL. Optionally, a content (or a concentration) of the electron transport oxide material OSM gradually decreases along a direction from the first electrode layer E1 to the quantum dots layer QDL. Optionally, a content (or a concentration) of the electron transport oxide material OSM gradually increases along a direction from the quantum dots layer QDL to the first electrode layer E1. As used herein, the term "gradually decrease" means that the content or the concentration decreases on the whole. The content or the concentration may change continuously in a linear or curved manner, or may change stepwise or in a wave state. Alternatively, for example, even when a region where the content or the concentration locally increases exists, the case where a generally decreasing content gradation or decreasing concentration gradation is present should be construed to fall within the intended scope of the present disclosure. As used herein, the term "gradually increase" means that the content or the concentration increases on the whole. The content or the concentration may change continuously in a linear or curved manner, or may change stepwise or in a wave state. Alternatively, for example, even when a region where the content or the concentration locally decreases exists, the case where a generally increasing content gradation or increasing concentration gradation is present should be construed to fall within the intended scope of the present disclosure.

In some embodiments, the electron transport oxide material OSM and the electron transport non-oxide chalcogen-containing material CSM share at least one metal element in common. Optionally, the electron transport non-oxide chalcogen-containing material CSM differs from the electron transport oxide material OSM in the substitution of the non-oxide chalcogen in the electron transport non-oxide chalcogen-containing material CSM for the oxygen ion in the electron transport oxide material OSM. In one example, the electron transport oxide material OSM includes $M_xO_y$, and the electron transport non-oxide chalcogen-containing material CSM includes $M_xC_y$, wherein M stands for a metal or an alloy, and C stands for a non-oxide chalcogen. In another example, the electron transport oxide material OSM includes ZnO, and the electron transport non-oxide chalcogen-containing material CSM includes ZnS.

In some embodiments, the electron transport non-oxide chalcogen-containing material sub-layer CSL and a quantum dots material of a portion of the quantum dots layer QDL most adjacent to the electron transport non-oxide chalcogen-containing material sub-layer CSL share at least one metal element in common. In some embodiments, the electron transport non-oxide chalcogen-containing material sub-layer CSL and a quantum dots material of a portion of the quantum dots layer QDL most adjacent to the electron transport non-oxide chalcogen-containing material sub-layer CSL share at least one non-metal element in common. Optionally, the electron transport non-oxide chalcogen-containing material sub-layer CSL and a quantum dots material of a portion of the quantum dots layer QDL most adjacent to the electron transport non-oxide chalcogen-containing material sub-layer CSL share at least one metal element in common and at least one non-metal element in common. In one example, the electron transport non-oxide chalcogen-containing material sub-layer CSL includes $M_xC_y$, and the quantum dots material of the portion of the quantum dots layer QDL most adjacent to the electron transport non-oxide chalcogen-containing material sub-layer CSL also includes $M_xC_y$, wherein M stands for a metal or an alloy, and C stands for a non-oxide chalcogen. In another example, the electron transport non-oxide chalcogen-containing material sub-layer CSL includes ZnS, and the quantum dots material of the portion of the quantum dots layer QDL most adjacent to the electron transport non-oxide chalcogen-containing material sub-layer CSL also includes ZnS.

In some embodiments, the electron transport layer ETL further includes an electron transport non-oxide chalcogen-containing material sub-layer CSL between the gradient alloy composite sub-layer GASL and the quantum dots layer QDL. Optionally, the electron transport non-oxide chalcogen-containing material sub-layer CSL is substantially free of the electron transport oxide material OSM. As used herein, the term "substantially free" in the context of the present disclosure means that a structure or a layer contains no significant amount of a certain material. In some embodiments, "substantially free" means that the structure or the layer contains no more than 5% by weight (e.g., no more than 4% by weight, no more than 3% by weight, no more than 2% by weight, no more than 1% by weight, no more than 0.5% by weight, no more than 0.2% by weight, or no more than 0.1% by weight) of the certain material. Optionally, "substantially free" means that the structure or the layer is completely free of the certain material.

In some embodiments, the electron transport layer ETL further includes an electron transport oxide material sub-layer OSL between the first electrode layer E1 and the gradient alloy composite sub-layer GASL. Optionally, the electron transport oxide material sub-layer OSL is substantially free of the electron transport non-oxide chalcogen-containing material.

In some embodiments, the quantum dots light emitting diode further includes an interface non-oxide chalcogen-containing compound ICC at an interface between the electron transport layer ETL and the quantum dots layer QDL. Optionally, the interface non-oxide chalcogen-containing compound ICC is at an interface between the electron transport non-oxide chalcogen-containing material sub-layer CSL and the portion of the quantum dots layer QDL most adjacent to the electron transport non-oxide chalcogen-containing material sub-layer CSL. Optionally, the interface non-oxide chalcogen-containing compound ICC includes a metal element from the quantum dots layer QDL. Optionally, the interface non-oxide chalcogen-containing compound ICC includes a non-oxide chalcogen from the electron transport layer ETL. Optionally, the interface non-oxide chalcogen-containing compound ICC includes a metal element from the portion of the quantum dots layer QDL most adjacent to the electron transport non-oxide chalcogen-containing material sub-layer CSL. Optionally, the interface non-oxide chalcogen-containing compound ICC is a reaction product of a metal element from the quantum dots layer QDL and a non-metal element from the electron transport non-oxide chalcogen-containing material sub-layer CSL. In one example, the quantum dots layer QDL (e.g., the portion of the quantum dots layer QDL most adjacent to the electron transport non-oxide chalcogen-containing material sub-layer CSL) includes a first metal element ML, and the electron transport non-oxide chalcogen-containing material sub-layer CSL includes a non-oxide chalcogen, and the interface non-oxide chalcogen-containing compound ICC is a reaction product of the first metal element M1 and the non-oxide chalcogen. Optionally, the interface non-oxide chalcogen-containing compound ICC results from formation of a covalent bond between the first metal element M1 and the non-oxide chalcogen. In one example, the quantum dots layer QDL (e.g., the portion of the quantum dots layer QDL most adjacent to the electron transport non-oxide chalcogen-containing material sub-layer CSL) includes Pb, and the electron transport non-oxide chalcogen-containing material sub-layer CSL includes ZnS, and the interface non-oxide chalcogen-containing compound ICC includes PbS.

Various appropriate quantum dots materials and various appropriate fabricating method may be used for making the quantum dots layer QDL. For example, a quantum dots material solution may be spin-coated on the substrate. Examples of appropriate quantum dots materials suitable for making the quantum dots layer QDL include CdS/ZnS, CdSe/ZnS, CdSe/ZnSeS, CdSe/CdS, ZnSe/ZnS, InP/ZnS, CuInS/ZnS, (Zn)CuInS/ZnS, (Mn)CuInS/ZnS, AgInS/ZnS, (Zn)AgInS/ZnS, CuInSe/ZnS, CuInSeS/ZnS, PbS/ZnS, an organic inorganic perovskite material, and an inorganic perovskite material. Examples of organic inorganic perovskite material include $MAPbX_3$, wherein MA stands for $CH_3NH_3$, X stands for a halide. Examples of inorganic perovskite material include $CsSb_2Br_9$, $CsBi_2Br_9$, $CsPbX_3$, wherein X stands for a halide. Optionally, the quantum dots includes a core and a shell covering the core. Optionally, the core includes a material selected from the group consisting of CdS, CdSe, ZnSe, InP, CuInS, (Zn)CuInS, (Mn)CuInS, AgInS, (Zn)AgInS, CuInSe, CuInSeS, PbS, an organic inorganic perovskite material, an inorganic perovskite material, and any combination or alloy thereof. Optionally, the shell includes a material selected from the group consisting of ZnS, ZnSeS, CdS, an organic inorganic perovskite material, an inorganic perovskite material, and any combination or alloy thereof.

Various appropriate electron transport oxide materials may be used for making the electron transport oxide material sub-layer OSL. Examples of appropriate electron transport oxide materials include zinc oxide, magnesium zinc oxide, aluminum zinc oxide, and magnesium aluminum zinc oxide.

Various appropriate electron transport non-oxide chalcogen-containing materials may be used for making the electron transport non-oxide chalcogen-containing material sub-layer CSL. Examples of appropriate electron transport non-oxide chalcogen-containing materials include zinc sulfide, magnesium zinc sulfide, aluminum zinc sulfide, magnesium aluminum zinc sulfide, cadmium sulfide, lead sulfide, bismuth (111) sulfide, and antimony trisulfide.

Various appropriate electron transport oxide materials and electron transport non-oxide chalcogen-containing materials may be used for making the gradient alloy composite sub-layer GASL. Examples of appropriate electron transport oxide materials include zinc oxide, magnesium zinc oxide, aluminum zinc oxide, and magnesium aluminum zinc oxide. Examples of appropriate electron transport non-oxide chalcogen-containing materials include zinc sulfide, magnesium zinc sulfide, aluminum zinc sulfide, and magnesium aluminum zinc sulfide.

In some embodiments, the quantum dots light emitting diode further includes a hole transport layer HTL on a side of the quantum dots layer QDL away from the first electrode layer E1, a hole injection layer HIL on a side of the hole transport layer HTL away from the first electrode layer E1, and a second electrode layer E2 on a side of the hole injection layer HIL away from the first electrode layer E1.

Various appropriate hole transport materials may be used for making the hole transport layer HTL. Examples of appropriate hole transport materials include, but are not limited to, various p-type polymer materials and various p-type low-molecular-weight materials. e.g., polythiophene, polyaniline, polypyrrole, and a mixture having poly-3,4-ethylenedioxythiophene and poly(sodium-p-stvrenesulfonate), 4,4'-cyclohexylidene bis[N,N-bis(4-methylphenyl)benzenamine (TAPC), 4,4',4"-tris(N-carbazolyl) triphenylamine (TCTA), N,N'-di(1-naphthyl)-N,N'-diphenylbenzidine (NPB), or any combination thereof.

Various appropriate hole injection materials may be used for making the hole injection layer HIL. Examples of appropriate hole injection materials include, but are not limited to, poly(3,4-ethylenedioxythiophene) polystyrene sulfonate (PEDOT:PSS), polythiophene, polyaniline, polypyrrole, copper phthalocyanine and 4,4',4"-tris(N,N-phenyl-3-methylphenylamino)triphenylamine (m-MTDATA), $MoO_3$, CuPc, poly(3,4-ethylenedioxythiophene)polystyrene sulfonate (PEDOT:PSS).

Various appropriate electrode materials and various appropriate fabricating methods may be used to make the first electrode layer E1 and the second electrode layer E2. For example, a transparent electrode material may be deposited on the substrate by a plasma-enhanced chemical vapor deposition (PECVD) process. Examples of appropriate electrode materials include, but are not limited to, various transparent metal oxide electrode materials, various transparent nano-carbon tubes, various metal materials, and a graphene electrode material. Examples of transparent metal oxide materials include, but are not limited to, indium tin oxide, indium zinc oxide, indium gallium oxide, and indium gallium zinc oxide. Examples of appropriate metal electrode materials include, but are not limited to, copper, aluminum, silver, molybdenum, chromium, neodymium, nickel, manganese, titanium, tantalum, and tungsten. Optionally, the first electrode layer E1 is made of a transparent metal oxide electrode material such as indium tin oxide. Optionally, the first electrode layer E1 is an indium tin oxide glass. Optionally, the second electrode layer E2 is made of a transparent metal oxide electrode material such as indium tin oxide.

Various appropriate methods may be used for determining the structures of various layers or sub-layers in the present quantum dots light emitting diode. Examples of appropriate structural determination methods include High-resolution transmission electron microscopy (HRTEM), cross-sectional scanning electron microscopy, X-ray powder diffraction (XRD), and secondary ion mass spectrometer (SIMS). For example, the X-ray powder diffraction method may be used for determining the presence of various sub-layers of the electron transport layer ETL. Optionally, the gradient alloy composite sub-layer GASL has a hexagonal crystal structure. Optionally, the electron transport non-oxide chalcogen-containing material sub-layer CSL has a wurtzite crystal structure. By detecting the presence of the hexagonal crystal and the wurtzite crystal in the electron transport layer ETL, e.g., using the X-ray powder diffraction method, the presence of the gradient alloy composite sub-layer GASL and/or the electron transport non-oxide chalcogen-containing material sub-layer CSL may be determined. Additional methods for determining the structure of various sub-layers of the electron transport layer ETL include Fourier-transform infrared spectroscopy (FITR), X-ray photoelectron spectroscopy (XPS), energy-dispersive X-ray spectroscopy (EDS), and electron energy loss spectroscopy (EELS).

Figure 2:
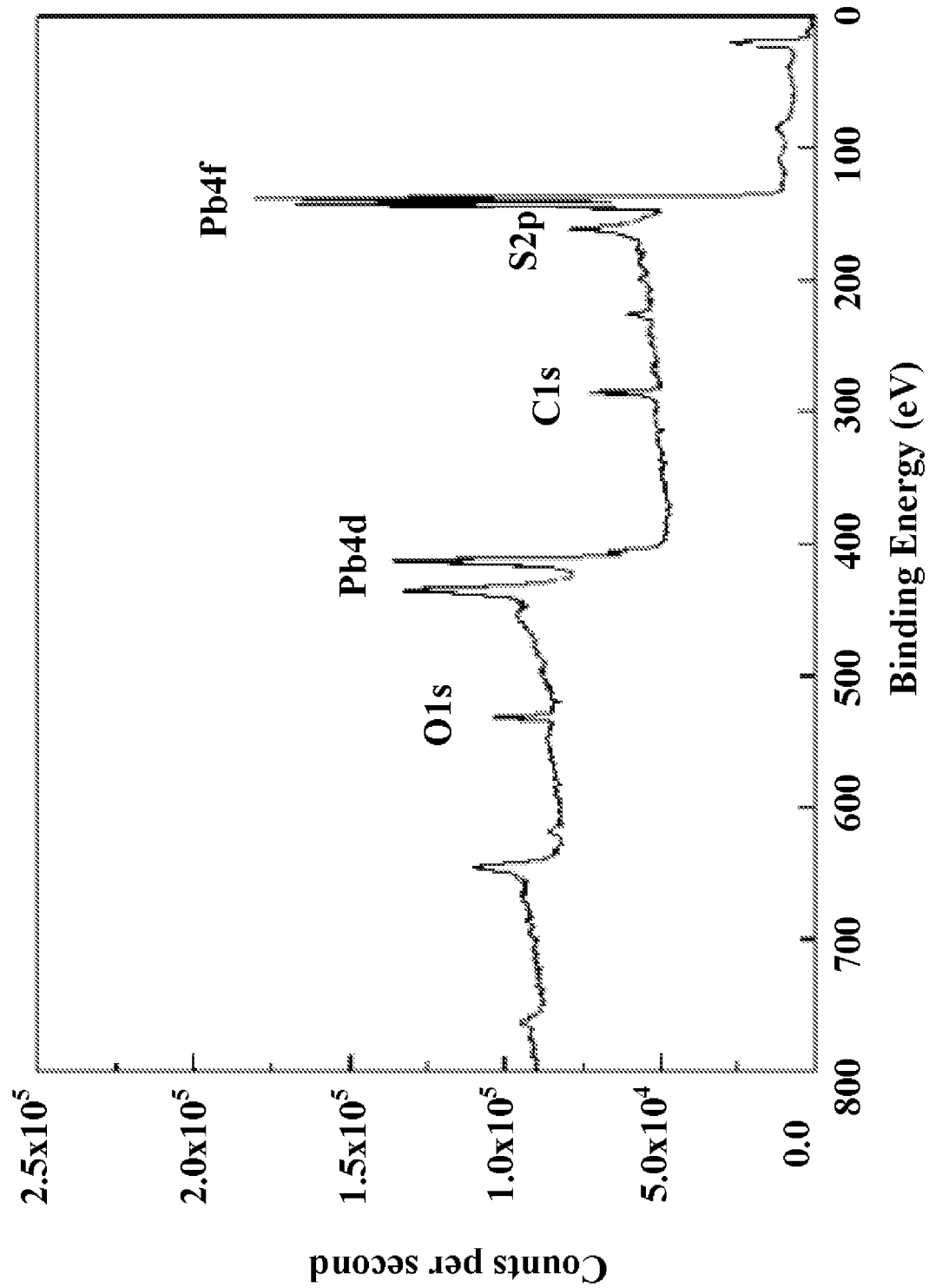
FIG. 2 is an X-ray photoelectron spectroscopy of a material from an interface between an electron transport non-oxide chalcogen-containing material sub-layer and a quantum dots layer in a quantum dots light emitting diode in some embodiments according to the present disclosure.

In one example, the presence of the interface non-oxide chalcogen-containing compound ICC may be detected by one or more spectroscopy methods described herein. FIG. 2 is an X-ray photoelectron spectroscopy of a material from an interface between an electron transport non-oxide chalcogen-containing material sub-layer and a quantum dots layer in a quantum dots light emitting diode in some embodiments according to the present disclosure. In one example, the quantum dots layer contains lead element (e.g., $CH_3NH_3PbCl_3$), and the electron transport non-oxide chalcogen-containing material sub-layer contains sulfide but not lead (e.g., ZnS). Referring to FIG. 2, the X-ray photoelectron spectroscopy of the material from the interface between the electron transport non-oxide chalcogen-containing material sub-layer and the quantum dots layer shows a S2p peak at a binding energy of 162 eV, and Pb4f peaks at a binding energy of 138.4 eV ($Pb4f_{7/2}$) as well as at a binding energy of 142.8 ($Pb4f_{5/2}$). These characteristic peaks confirms the presence of PbS at the interface between the electron transport non-oxide chalcogen-containing material sub-layer and the quantum dots layer, indicating the presence of the interface non-oxide chalcogen-containing compound ICC at the interface.

Similarly, the characteristics of the quantum dots layer can also be determined by various appropriate methods. In one example, the high-resolution transmission electron microscopy, the X-ray photoelectron spectroscopy, and the energy-dispersive X-ray spectroscopy may be used for determining the crystal structures and/or compositions of the quantum dots. In another example, the characteristics of surface ligands of the quantum dots may be analyzed and quantified by various methods such as Fourier-transform infrared spectroscopy, UV-visible light absorption spectroscopy, and proton nuclear magnetic resonance. In another example, the compositions of the surface ligands of the quantum dots (including the quantum dots on the bottom and quantum dots on lateral sides) may be determined by various methods such as the energy-dispersive X-ray spectroscopy (EDS) and the electron energy loss spectroscopy. In another example, spectral characteristics of the quantum dots may be determined by various methods such as the UV-visible light absorption spectroscopy and photoluminescence spectroscopy.

In some embodiments, the present quantum dots light emitting diode includes a gradient alloy composite sub-layer GASL, which has a broad-spectrum adaptability of energy levels and can be used for making quantum dots of different forbidden band levels (e.g., red quantum dots, green quantum dots, and blue quantum dots). In particular, the gradient alloy composite sub-layer GASL (e.g., a ZnO—ZnS gradient alloy composite sub-layer) has an adjustable energy level structure. Quantum dots of different colors have different energy band gaps. By adjusting the composition of the gradient alloy composite sub-layer GASL (e.g., by adjusting relative contents of the electron transport oxide material and the electron transport non-oxide chalcogen-containing material), the electron transport layer's work function may be adjusted. Thus, in some embodiments, quantum dots of different colors (e.g., quantum dots of red color, quantum dots of green color, and quantum dots of blue colors in a same display panel) may be conveniently fabricated in a same process, with the relative contents of the electron transport oxide material and the electron transport non-oxide chalcogen-containing material respectively adjusted for quantum dots of different colors.

In some embodiments, the present quantum dots light emitting diode includes an interface non-oxide chalcogen-containing compound ICC at an interface between the electron transport layer ETL and the quantum dots layer QDL. Electrons may be transported into the quantum dots layer QDL through multiple pathways. In one example, the electrons may be transported from the electron transport oxide material (e.g., ZnO), through the surface ligands of the quantum dots, to the inorganic nano-crystals of the quantum dots. In another example, by having the interface non-oxide chalcogen-containing compound ICC directly connecting the electron transport non-oxide chalcogen-containing material (e.g., ZnS) and the crystals of the quantum dots, a new electron transportation pathway is formed in the present quantum dots light emitting diode, expediting transportation of interface electrons into the quantum dots. By having multiple electron transportation pathways, electron accumulation at the interface may be prevented, and the stability of the functional layers may be enhanced.

In some embodiments, the present quantum dots light emitting diode includes an electron transport non-oxide chalcogen-containing material sub-layer CSL. The formation of the electron transport non-oxide chalcogen-containing material sub-layer CSL largely eliminates surface hydroxyl group present on the surface of the electron transport oxide material, reducing the interface quenching effect of the electron transport layer ETL on the quantum dots layer QDL. In some embodiments, the electron transport non-oxide chalcogen-containing material sub-layer CSL and a quantum dots material of a portion of the quantum dots layer QDL most adjacent to the electron transport non-oxide chalcogen-containing material sub-layer CSL share at least one metal element in common and at least one non-metal element in common. Composition similarity between the electron transport non-oxide chalcogen-containing material sub-layer CSL and the quantum dots layer QDL results in an enhanced compatibility among functional layers.

In some embodiments, the gradient alloy composite sub-layer GSAL has a hexagonal crystal structure, and the electron transport non-oxide chalcogen-containing material sub-layer CSL has a wurtzite crystal structure. Thus, the gradient alloy composite sub-layer GSAL and the electron transport non-oxide chalcogen-containing material sub-layer CSL have similar crystal structures and similar crystal morphologies, obviating the issue of internal defects in the electron transport layer ETL due to differing crystal lattice constants between the gradient alloy composite sub-layer GSAL and the electron transport non-oxide chalcogen-containing material sub-layer CSL, and significantly enhancing the stability of the light emitting diode.

In another aspect, the present disclosure provides a method of fabricating a quantum dots light emitting diode. In some embodiments, the method includes providing a first electrode layer; forming an electron transport layer on the first electrode layer; forming a quantum dots layer on a side of the electron transport layer away from the first electrode layer. Optionally, forming the electron transport layer includes forming a gradient alloy composite sub-layer including an electron transport oxide material and an electron transport non-oxide chalcogen-containing material. Optionally, the non-oxide chalcogen is selected from a group consisting of sulfide ion, selenium ion, and tellurium ion. Optionally, the electron transport non-oxide chalcogen-containing material has a gradient distribution such that a content of the electron transport non-oxide chalcogen-containing material decreases along a direction from the quantum dots layer to the first electrode layer.

In some embodiments, the step of forming the gradient alloy composite sub-layer includes forming an oxide material coating on the first electrode layer; exposing the oxide material coating to a chalcogenization reagent; and heating the oxide material coating during or subsequent to exposing the oxide material coating to the chalcogenization reagent, thereby forming the gradient alloy composite sub-layer. Optionally, the step of forming the gradient alloy composite sub-layer further includes adjusting a degree of chalcogenization of the oxide material by adjusting one or a combination of a heating temperature and a heating duration when heating the oxide material coating. Optionally, the method further includes determining the degree of chalcogenization based on a light emission color of the quantum dots layer.

In some embodiments, the step of forming the oxide material coating includes coating a precursor solution on the first electrode layer, wherein the precursor solution includes at least one metal element that the electron transport oxide material and the electron transport non-oxide chalcogen-containing material include in common; and heating the precursor solution on the first electrode layer in an oxygen-containing atmosphere, thereby oxidizing the precursor solution into the oxide material coating.

In some embodiments, the method further includes forming an electron transport oxide material sub-layer between the first electrode layer and the gradient alloy composite sub-layer; and forming an electron transport non-oxide chalcogen-containing material sub-layer between the gradient alloy composite sub-layer and the quantum dots layer. Optionally, the electron transport oxide material sub-layer is substantially free of the electron transport non-oxide chalcogen-containing material. Optionally, the electron transport non-oxide chalcogen-containing material sub-layer is substantially free of the electron transport oxide material. Optionally, the steps of forming the electron transport oxide material sub-layer, forming the electron transport non-oxide chalcogen-containing material sub-layer, and forming the gradient alloy composite sub-layer are performed in a same process during heating the oxide material coating.

In some embodiments, the method further includes forming an interface non-oxide chalcogen-containing compound at an interface between the electron transport layer and the quantum dots layer. Optionally, the interface non-oxide chalcogen-containing compound includes a metal element from the quantum dots layer. Optionally, the interface non-oxide chalcogen-containing compound includes a non-oxide chalcogen from the electron transport layer. Optionally, the step of forming the quantum dots layer includes coating a quantum dots solution on the electron transport layer. Optionally, during forming the quantum dots layer, a metal element from the quantum dots solution reacts with the electron transport non-oxide chalcogen-containing material in the electron transport non-oxide chalcogen-containing material sub-layer, thereby forming the interface non-oxide chalcogen-containing compound at an interface between the electron transport non-oxide chalcogen-containing material sub-layer and the quantum dots layer. Optionally, the step of forming the quantum dots layer further includes annealing the quantum dots solution coated on the electron transport layer at an annealing temperature lower than 200 degree Celsius. Optionally, during annealing the quantum dots solution, the metal element from the quantum dots solution further reacts with the electron transport non-oxide chalcogen-containing material in the electron transport non-oxide chalcogen-containing material sub-layer, forming additional interface non-oxide chalcogen-containing compounds at an interface between the electron transport non-oxide chalcogen-containing material sub-layer and the quantum dots layer.

In some embodiments, the method includes providing a first electrode layer; forming an electron transport layer on the first electrode layer; forming a quantum dots layer on a side of the electron transport layer away from the first electrode layer; and forming an interface non-oxide chalcogen-containing compound at an interface between the electron transport layer and the quantum dots layer. Optionally, forming the electron transport layer includes forming a gradient alloy composite sub-layer including an electron transport oxide material and an electron transport non-oxide chalcogen-containing material. Optionally, the interface non-oxide chalcogen-containing compound includes a metal element from the quantum dots layer. Optionally, the interface non-oxide chalcogen-containing compound includes a non-oxide chalcogen from the electron transport layer. Optionally, the non-oxide chalcogen is selected from a group consisting of sulfide ion, selenium ion, and tellurium ion.

In some embodiments, the electron transport non-oxide chalcogen-containing material has a gradient distribution such that a content of the electron transport non-oxide chalcogen-containing material decreases along a direction from the quantum dots layer to the first electrode layer.

In some embodiments, the step of forming the gradient alloy composite sub-layer includes forming an oxide material coating on the first electrode layer; exposing the oxide material coating to a chalcogenization reagent; and heating the oxide material coating during or subsequent to exposing the oxide material coating to the chalcogenization reagent, thereby forming the gradient alloy composite sub-layer. Optionally, the step of forming the gradient alloy composite sub-layer further includes adjusting a degree of chalcogenization of the oxide material by adjusting one or a combination of a heating temperature and a heating duration when heating the oxide material coating. Optionally, the method further includes determining the degree of chalcogenization based on a light emission color of the quantum dots layer.

In some embodiments, the step of forming the oxide material coating includes coating a precursor solution on the first electrode layer, wherein the precursor solution includes at least one metal element that the electron transport oxide material and the electron transport non-oxide chalcogen-containing material include in common; and heating the precursor solution on the first electrode layer in an oxygen-containing atmosphere, thereby oxidizing the precursor solution into the oxide material coating.

In some embodiments, the method further includes forming an electron transport oxide material sub-layer between the first electrode layer and the gradient alloy composite sub-layer; and forming an electron transport non-oxide chalcogen-containing material sub-layer between the gradient alloy composite sub-layer and the quantum dots layer. Optionally, the electron transport oxide material sub-layer is substantially free of the electron transport non-oxide chalcogen-containing material. Optionally, the electron transport non-oxide chalcogen-containing material sub-layer is substantially free of the electron transport oxide material. Optionally, the steps of forming the electron transport oxide material sub-layer, forming the electron transport non-oxide chalcogen-containing material sub-layer, and forming the gradient alloy composite sub-layer are performed in a same process during heating the oxide material coating.

In some embodiments, the step of forming the quantum dots layer includes coating a quantum dots solution on the electron transport layer. Optionally, during forming the quantum dots layer, a metal element from the quantum dots solution reacts with the electron transport non-oxide chalcogen-containing material in the electron transport non-oxide chalcogen-containing material sub-layer, thereby forming the interface non-oxide chalcogen-containing compound at an interface between the electron transport non-oxide chalcogen-containing material sub-layer and the quantum dots layer. Optionally, the step of forming the quantum dots layer further includes annealing the quantum dots solution coated on the electron transport layer at an annealing temperature lower than 200 degree Celsius. Optionally, during annealing the quantum dots solution, the metal element from the quantum dots solution further reacts with the electron transport non-oxide chalcogen-containing material in the electron transport non-oxide chalcogen-containing material sub-layer, forming additional interface non-oxide chalcogen-containing compounds at an interface between the electron transport non-oxide chalcogen-containing material sub-layer and the quantum dots layer.

Figure 3A:
FIGS. 3A to 3F illustrate a method of fabricating a quantum dots light emitting diode in some embodiments according to the present disclosure.

FIGS. 3A to 3F illustrate a method of fabricating a quantum dots light emitting diode in some embodiments according to the present disclosure. Referring to FIG. 3A, a first electrode layer E1 is formed. In one example, the first electrode layer E1 is provided as an indium tin oxide glass substrate. Optionally, the surface of the first electrode layer E1 is cleaned. In one example, the surface of the first electrode layer E1 is cleaned using isopropanol, water, and acetone, respectively in separate steps, and with ultrasonic sound. Subsequently, the first electrode layer E1 is treated with UV radiation for a duration of 5 minutes to 10 minutes.

Figure 3B:
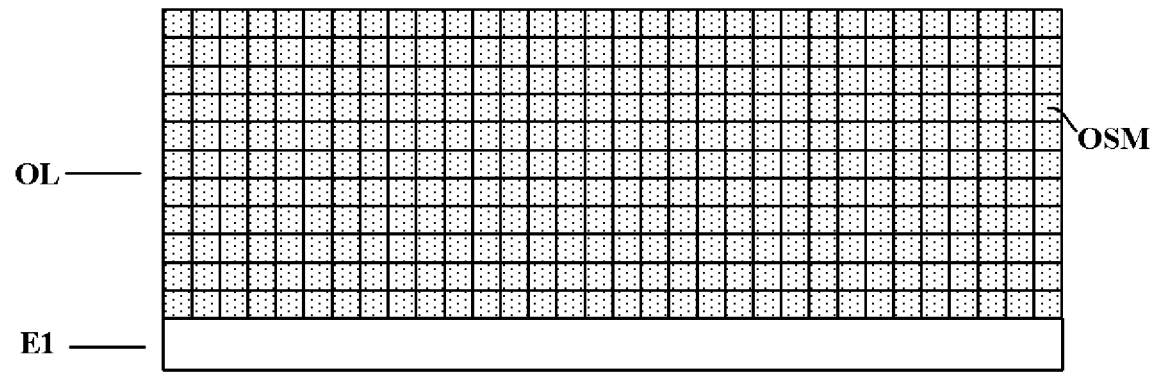

Referring to FIG. 3B, an oxide material coating OL is formed on the first electrode layer E1. In some embodiments, a precursor solution is coated on the first electrode layer E1, the precursor solution includes at least one metal element that the electron transport oxide material and the electron transport non-oxide chalcogen-containing material share in common. The precursor solution coated on the first electrode layer E1 is then heated in an oxygen-containing atmosphere, thereby oxidizing the precursor solution into the oxide material coating. In one example, an electron transport precursor solution (e.g., a solution having zinc acetate dissolved in a mixture solvent including ethanol amine and butanol) is coated evenly on the first electrode layer E1. In one example, the electron transport precursor solution is spin-coated on the first electrode layer E1, with a spinning speed in a range of 500 rpm to 2500 rpm. The first electrode layer E1 coated with the electron transport precursor solution is heated at a temperature in a range of 250 degree Celsius to 300 degree Celsius to remove the solvent and to oxidize the electron transport precursor solution in an oxygen-containing atmosphere, thereby forming the oxide material coating OL. In one example, the electron transport oxide material coating OL include ZnO.

Figure 3C:
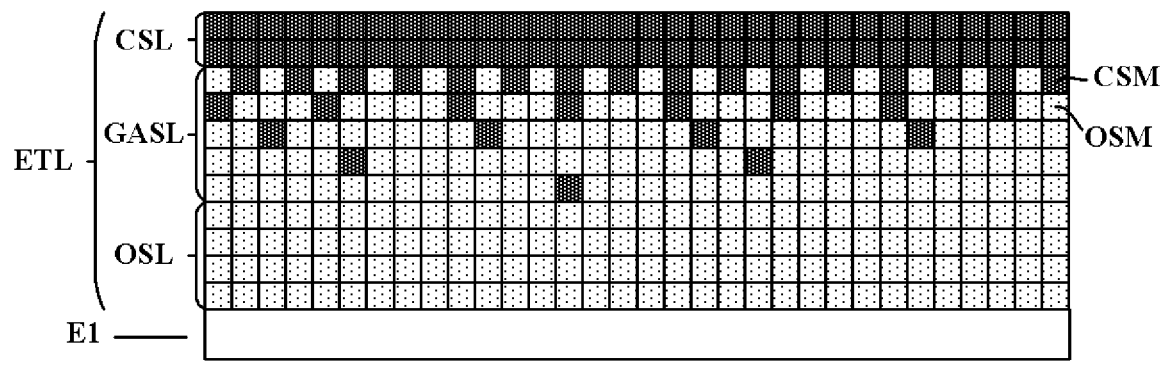

Referring to FIG. 3C, the oxide material coating is converted into an electron transport layer ETL. In some embodiments, the electron transport layer ETL is formed to include an electron transport oxide material sub-layer OSL on the first electrode layer E1, a gradient alloy composite sub-layer GASL on a side of the electron transport oxide material sub-layer OSL away from the first electrode layer E1, and an electron transport non-oxide chalcogen-containing material sub-layer CSL on a side of the gradient alloy composite sub-layer GASL away from the electron transport oxide material sub-layer OSL. The gradient alloy composite sub-layer GASL is formed to include an electron transport oxide material OSM and an electron transport non-oxide chalcogen-containing material CSM. Optionally, the electron transport non-oxide chalcogen-containing material CSM in the gradient alloy composite sub-layer GASL has a gradient distribution such that a content of the electron transport non-oxide chalcogen-containing material CSM decreases along a direction from the quantum dots layer QDL to the first electrode layer E1. Optionally, the electron transport oxide material OSM in the gradient alloy composite sub-layer GASL has a gradient distribution such that a content of the electron transport oxide material decreases along a direction from the first electrode layer E1 to the quantum dots layer QDL.

In one example, the oxide material coating is converted into an electron transport layer ETL by exposing the oxide material coating to a chalcogenization reagent, and heating the oxide material coating during or subsequent to exposing the oxide material coating to the chalcogenization reagent. Optionally, the chalcogenization reagent is a sulfurization reagent. In one example, the oxide material coating is exposed to an ethanol solution of 1 mol/L aminothiourea (or thioacetamide), and subsequently the substrate is placed in an oven to anneal the substrate. Specifically, the substrate is placed on a heating plate at a heating temperature in a range of 70 degree Celsius to 100 degree Celsius to evaporate the solvent. Subsequently, the annealing temperature is increased to a higher annealing temperature (e.g., 200 degree Celsius, 250 degree Celsius, 300 degree Celsius, 350 degree Celsius, 400 degree Celsius, or 450 degree Celsius) during an annealing duration of about 30 minutes. In the annealing process, the surface of the oxide material coating is converted into a sulfide material (e.g., ZnS), and the middle sub-layer of the oxide material coating is converted into the gradient alloy composite sub-layer GASL. Table 1 lists a relationship between annealing temperatures and work function of the electron transport layer when the oxide material coating includes ZnO. As a comparison, the work function of ZnO without annealing is 4.20 eV, and the work function of a perovskite quantum dots is −3.80 eV.

TABLE 1

Work function of the electron transport layer

| Annealing temperature (° C.) | Work function (eV) |
|---|---|
| 350 | −3.33 |
| 400 | −3.67 |
| 450 | −3.94 |
| 500 | −4.15 |

As shown in Table 1, the work function and the energy band structure of the electron transport layer can be effectively adjusted by a degree of chalcogenization of the oxide material. The degree of chalcogenization of the oxide material can be realized by adjusting one or a combination of a heating temperature and a heating duration when heating the oxide material coating. Accordingly, quantum dots layer of different color may be conveniently fabricated by adjusting the degree of chalcogenization.

Figure 4:
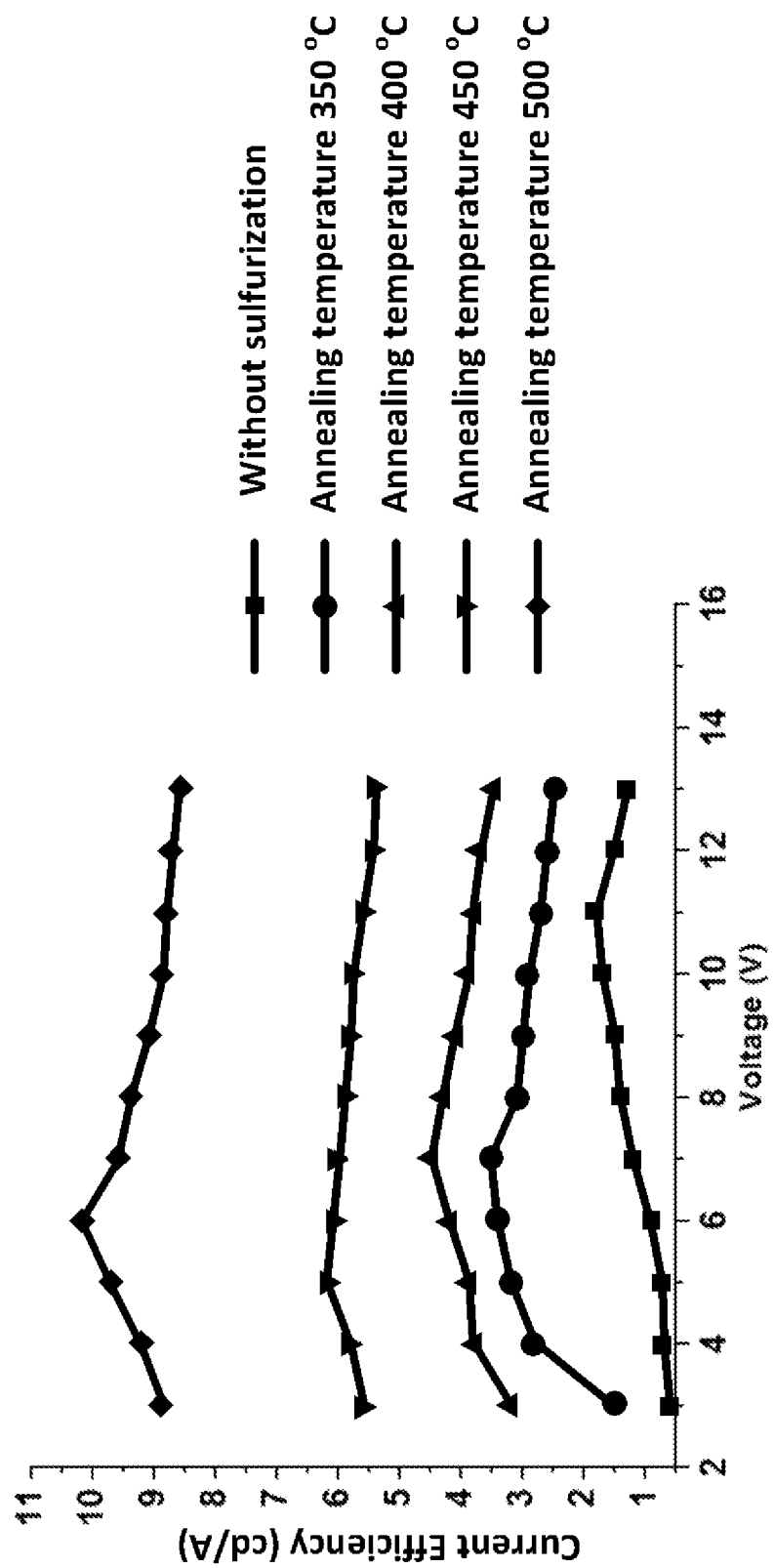
FIG. 4 illustrates a correlation between an annealing temperature of a sulfurization process of zinc oxide and a current efficiency of a light emitting diode in some embodiments according to the present disclosure.

FIG. 4 illustrates a correlation between an annealing temperature of a sulfurization process of zinc oxide and a current efficiency of a light emitting diode in some embodiments according to the present disclosure. Referring to FIG. 4, light emitting diodes having zinc oxide undergo a sulfurization process have much higher current efficiencies as compared to the light emitting diode having zinc oxide without sulfurization. For the light emitting diodes having zinc oxide undergone the sulfurization process, a maximum current efficiency (10.2 cd/A) can be achieved at an annealing temperature of 500 degree Celsius.

Referring to FIG. 3C, at least a portion of the oxide material coating in direct contact with the first electrode layer E1 is not chalcogenized, thereby forming the electron transport oxide material sub-layer OSL of the electron transport layer ETL. The electron transport oxide material sub-layer OSL is substantially free of the electron transport non-oxide chalcogen-containing material. The electron transport non-oxide chalcogen-containing material sub-layer CSL is substantially free of the electron transport oxide material. Optionally, forming the electron transport oxide material sub-layer OSL, forming the electron transport non-oxide chalcogen-containing material sub-layer CSL, and forming the gradient alloy composite sub-layer GASL are performed in a same process during heating the oxide material coating.

Figure 3D:
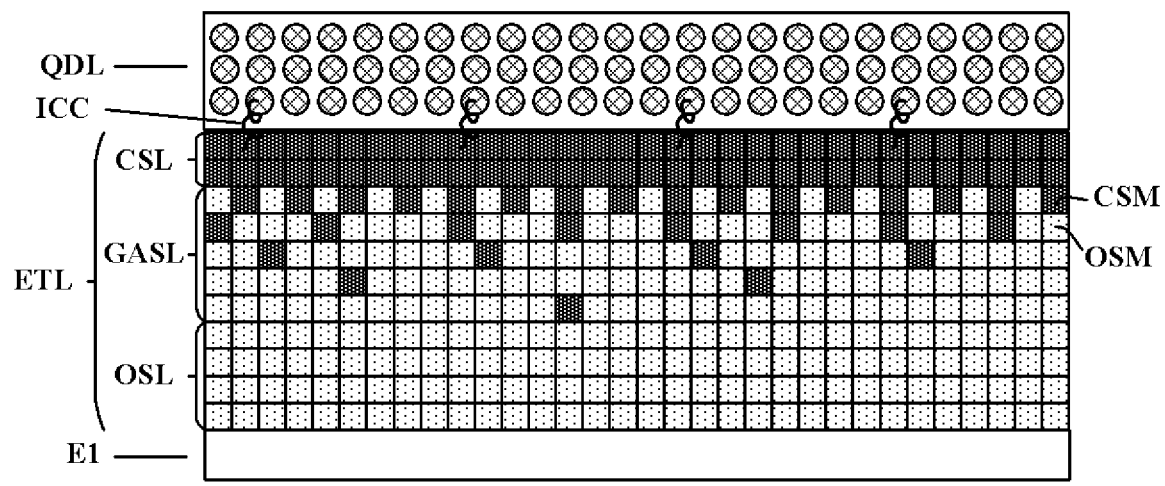

Referring to FIG. 3D, a quantum dots coating QDC is formed on a side of the electron transport layer ETL away from the first electrode layer E1. Optionally, the quantum dots coating QDC is formed by coating a quantum dots solution on the electron transport layer ETL. Specifically, the quantum dots coating QDC is formed by coating a quantum dots solution on the electron transport non-oxide chalcogen-containing material sub-layer CSL. In one example, the quantum dots solution is a solution of quantum dots in an organic solvent such as hexane or octane. The quantum dots solution is spin-coated on the surface of the electron transport layer ETL, with a spinning speed in a range of 500 rpm to 2500 rpm. A metal element from the quantum dots coating QDC reacts with the electron transport non-oxide chalcogen-containing material CSM in the electron transport non-oxide chalcogen-containing material sub-layer CSL, thereby forming an interface non-oxide chalcogen-containing compound ICC at an interface between the electron transport non-oxide chalcogen-containing material sub-layer CSL and the quantum dots layer QDL.

Figure 3E:
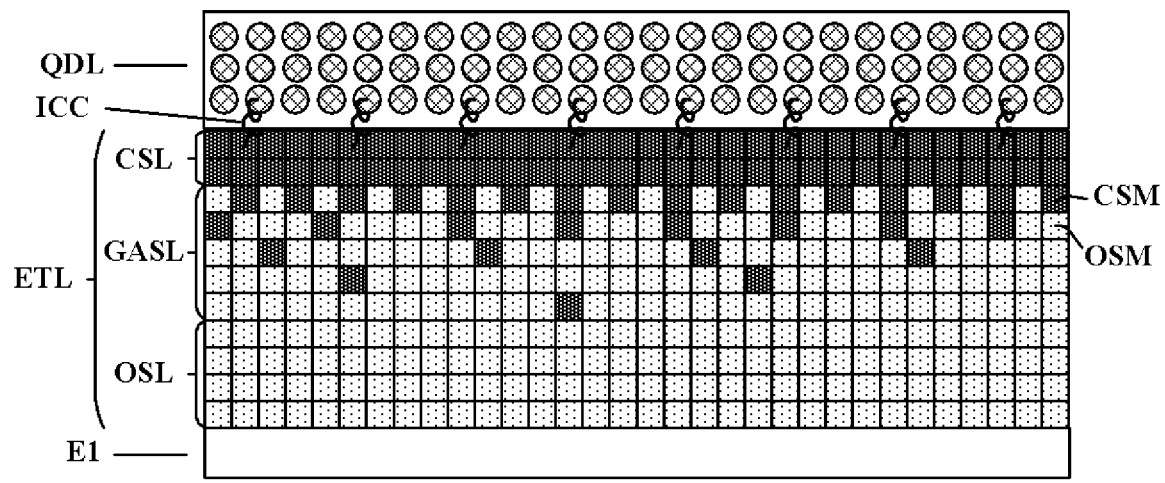

Referring to FIG. 3E, subsequent to forming the quantum dots coating QDC, the quantum dots coating QDC is annealed to form the quantum dots layer QDL. Optionally, the annealing step is performed at an annealing temperature lower than 200 degree Celsius, e.g., about 180 degree Celsius, about 160 degree Celsius. During annealing the quantum dots coating QDC, a metal element from the quantum dots solution reacts with the electron transport non-oxide chalcogen-containing material CSM in the electron transport non-oxide chalcogen-containing material sub-layer CSL, forming additional interface non-oxide chalcogen-containing compounds at an interface between the electron transport non-oxide chalcogen-containing material sub-layer and the quantum dots layer.

Figure 3F:
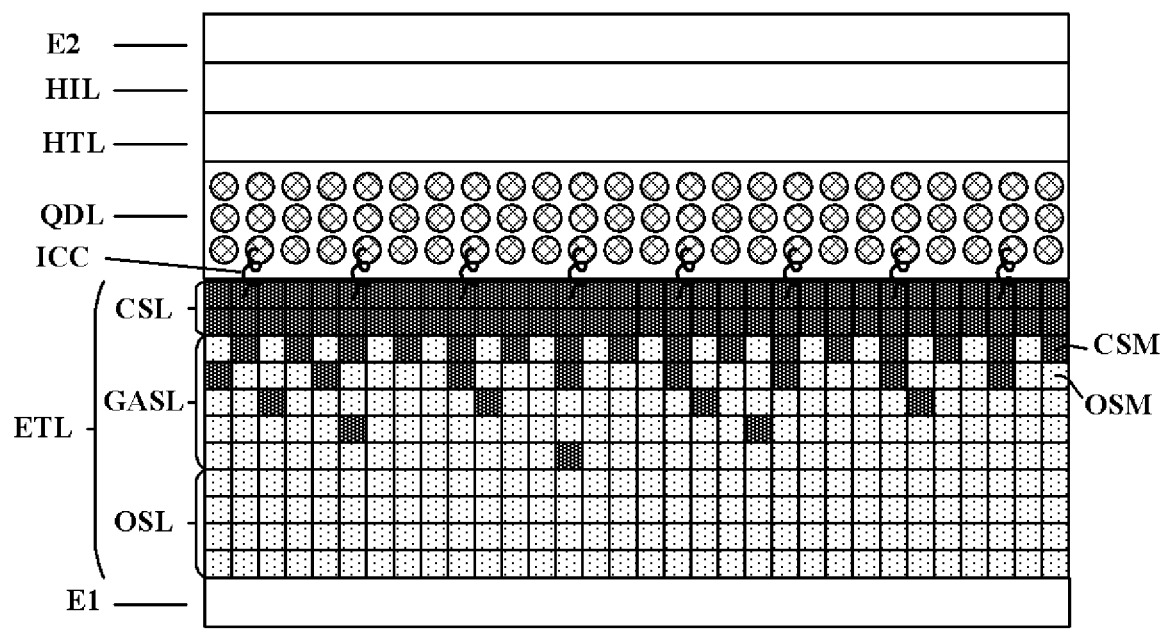

Referring to FIG. 3F, subsequent to annealing the quantum dots coating QDC to form the quantum dots layer QDL, a hole transport layer HTL is formed on a side of the quantum dots layer QDL away from the first electrode layer E1, a hole injection layer HIL is formed on a side of the hole transport layer HTL away from the first electrode layer E1, and a second electrode layer E2 is formed on a side of the hole injection layer HIL away from the first electrode layer E1, thereby forming a quantum dots light emitting diode. In one example, the hole transport layer HTL is formed using one of Merck HT®, TFB®, or DuPont HT®. In another example, the step of forming the hole transport layer HTL is performed by spin-coating the Merck HT® at a temperature in a range of 200 degree Celsius to 230 degree Celsius under an inert atmosphere. In another example, the step of forming the hole transport layer HTL is performed by spin-coating the TFB® at a temperature in a range of 130 degree Celsius to 150 degree Celsius under an inert atmosphere. In another example, the step of forming the hole transport layer HTL is performed by spin-coating the DuPont HT® at a temperature in a range of 200 degree Celsius to 230 degree Celsius under an inert atmosphere.

In another example, the hole injection layer HIL is formed using one of Merck HI®, Nissan 2520®, PEDOT 4083®, PEDOT 1.3N®, or DuPont HI®. In another example, the step of forming the hole injection layer HIL is performed by spin-coating the Merck HI® at a temperature in a range of 200 degree Celsius to 230 degree Celsius under an inert atmosphere. In another example, the step of forming the hole injection layer HIL is performed by spin-coating PEDOT at a temperature in a range of 130 degree Celsius to 150 degree Celsius under an inert atmosphere.

In another example, the second electrode layer E2 is formed using aluminum or indium zinc oxide.

Figure 5:
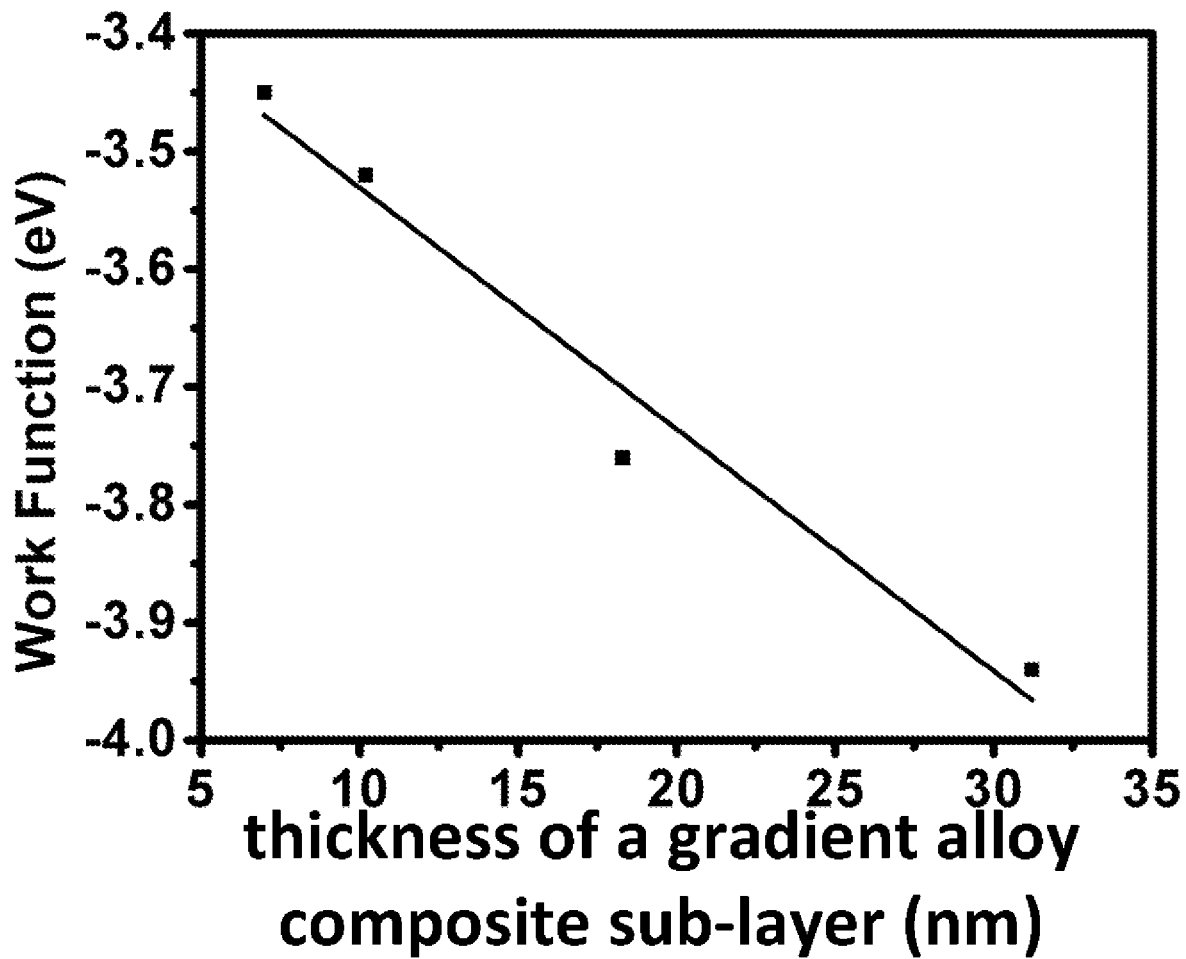
FIG. 5 illustrates a linear correlation between a thickness of a gradient alloy composite sub-layer of an electron transport layer and a work function thereof in some embodiments according to the present disclosure.

The correlation between thicknesses of various sub-layers (e.g., the gradient alloy composite sub-layer GASL) of the electron transport layer ETL and a work function of the electron transport layer ETL can be measured experimentally. FIG. 5 illustrates a linear correlation between a thickness of a gradient alloy composite sub-layer of an electron transport layer and a work function thereof in some embodiments according to the present disclosure. Referring to FIG. 5, the work function of the electron transport layer ETL is plotted against the thickness of the gradient alloy composite sub-layer GASL, a linear correlation $Y=3.325-0.02X$ is obtained, wherein Y stands for the work function, and X stands for the thickness of the gradient alloy composite sub-layer GASL. A goodness-of-fit $R^2$ of 0.95332 is achieved, indicating an excellent linear fit. Thus, the linear correlation can be experimentally obtained and used in fabricating quantum dots light emitting diode having electron transport layers of various work functions.

In one example, a zinc oxide film was formed on an indium tin oxide glass substrate. By adjusting the zinc oxide concentration and the spin-coating speed, a zinc oxide film having a thickness of approximately 50 nm are achieved. The indium tin oxide glass substrate with the zinc oxide film formed thereon was then immersed in an ethanol solution of 1 mol/L aminothiourea. Subsequent to the sulfurization process, the substrate was annealed in an oven and under an inert atmosphere. Multiple samples were prepared and respectively annealed with different annealing duration, e.g., 5 minutes, 10 minutes, 20 minutes, and 30 minutes. During the annealing process, the surface of the zinc oxide film was converted into a sulfide material (e.g., ZnS), and the middle sub-layer of the zinc oxide film was converted into the gradient alloy composite sub-layer, and the lower layer of the zinc oxide film remained as a zinc oxide sub-layer. Different thicknesses of the gradient alloy composite sub-layer are achieved by different annealing durations. The samples were then sectioned, and subject to focused ion beam scanning electron microscopy analysis in combination with X-ray energy spectroscopy analysis. Thicknesses of various sub-layers were determined. The work functions of the electron transport layers in different samples were determined using ultraviolet photoelectron spectroscopy. Table 2 list the thicknesses of various sub-layers of the electron transport layer and the work functions in different samples.

TABLE 2

Thicknesses of various-layers of the electron transport layer and the work functions in different samples.

| Annealing temperature | Annealing duration | Thickness of zinc sulfide sub-layer | Thickness of gradient alloy composite sub-layer (ZnO/ZnS alloy sub-layer) | Thickness of zinc oxide sub-layer | Work function (eV) |
|---|---|---|---|---|---|
| 450° C. | 5 min | 1 nm | 7 nm | 42 nm | −3.45 |
| 450° C. | 10 min | 1.8 nm | 10.2 nm | 38 nm | −3.52 |
| 450° C. | 20 min | 2.7 nm | 18.3 nm | 29 nm | −3.76 |
| 450° C. | 30 min | 3.8 nm | 31.2 nm | 15 nm | −3.94 |

In another aspect, the present disclosure provides a display apparatus including a quantum dots light emitting diode described herein or fabricated by a method described herein. Optionally, the display apparatus further includes a pixel driving circuit connected to the quantum dots light emitting diode. Optionally, the display apparatus includes a display panel. Optionally, the display panel includes an array substrate having a quantum dots light emitting diode described herein or fabricated by a method described herein, and a counter substrate facing the array substrate. Optionally, display apparatus further includes one or more integrated circuits connected to the display panel.

Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A quantum dots light emitting diode, comprising:
a first electrode layer;
an electron transport layer on the first electrode layer;
a quantum dots layer on a side of the electron transport layer away from the first electrode layer; and
an interface non-oxide chalcogen-containing compound at an interface between the electron transport layer and the quantum dots layer;
wherein the electron transport layer comprises an electron transport non-oxide chalcogen-containing material;
the electron transport non-oxide chalcogen-containing material comprising a non- oxide chalcogen;
the interface non-oxide chalcogen-containing compound comprises a metal element from the quantum dots layer and the non-oxide chalcogen from the electron transport layer;
the non-oxide chalcogen is selected from a group consisting of sulfide ion, selenium ion, and tellurium ion;
the electron transport layer comprises a gradient alloy composite sub-layer comprising an electron transport oxide material and the electron transport non-oxide chalcogen-containing material; and
the electron transport non-oxide chalcogen-containing material has a gradient distribution such that a content of the electron transport non-oxide chalcogen-containing material decreases along a direction from the quantum dots layer to the first electrode layer.

2. The quantum dots light emitting diode of claim 1, wherein the electron transport oxide material has a gradient distribution such that a content of the electron transport oxide material decreases along a direction from the first electrode layer to the quantum dots layer.

3. The quantum dots light emitting diode of claim 1, wherein the electron transport oxide material and the electron transport non-oxide chalcogen-containing material comprise at least one metal element in common.

4. The quantum dots light emitting diode of claim 1, wherein the electron transport layer further comprises an electron transport non-oxide chalcogen-containing material sub-layer between the gradient alloy composite sub-layer and the quantum dots layer;
wherein the electron transport non-oxide chalcogen-containing material sub-layer is substantially free of the electron transport oxide material.

5. The quantum dots light emitting diode of claim 4, wherein the interface non-oxide chalcogen-containing compound is at an interface between the electron transport non-oxide chalcogen-containing material sub-layer and the quantum dots layer.

6. The quantum dots light emitting diode of claim 4, wherein the electron transport non-oxide chalcogen-containing material sub-layer and a quantum dots material of a portion of the quantum dots layer most adjacent to the electron transport non-oxide chalcogen-containing material sub-layer comprise at least one metal element in common and at least one non-metal element in common.

7. The quantum dots light emitting diode of claim 4, wherein the gradient alloy composite sub-layer has a hexagonal crystal structure; and the electron transport non-oxide chalcogen-containing material sub-layer has a wurtzite crystal structure.

8. The quantum dots light emitting diode of claim 1, wherein the electron transport layer further comprises an electron transport oxide material sub-layer between the first electrode layer and the gradient alloy composite sub-layer;

wherein the electron transport oxide material sub-layer is substantially free of the electron transport non-oxide chalcogen-containing material.

9. The quantum dots light emitting diode of claim 1, wherein the quantum dots layer comprises a core and a shell;

wherein the core comprises a material selected from the group consisting of CdS, CdSe, ZnSe, InP, CuInS, (Zn) CuInS, (Mn) CuInS, AgInS, (Zn) AgInS, CuInSe, CuInSeS, PbS, an organic inorganic perovskite material, an inorganic perovskite material, and any combination or alloy thereof; and the shell comprises a material selected from the group consisting of ZnS, ZnSeS, CdS, an organic inorganic perovskite material, an inorganic perovskite material, and any combination or alloy thereof.

10. The quantum dots light emitting diode of claim 1, wherein the electron transport oxide material is a material selected from the group consisting of zinc oxide, magnesium zinc oxide, aluminum zinc oxide, and magnesium aluminum zinc oxide.

11. The quantum dots light emitting diode of claim 1, wherein the electron transport non-oxide chalcogen-containing material is a material selected from the group consisting of zinc sulfide, magnesium zinc sulfide, aluminum zinc sulfide, and magnesium aluminum zinc sulfide.

12. The quantum dots light emitting diode of claim 1, wherein the gradient alloy composite sub-layer has a hexagonal crystal structure.

13. A display apparatus, comprising an array of the quantum dots light emitting diode of claim 1, and a pixel driving circuit connected to the quantum dots light emitting diode;

wherein the quantum dots light emitting diode further comprises a second electrode layer on a side of the quantum dots layer away from the first electrode layer.

14. A quantum dots light emitting diode, comprising:

a first electrode layer;

an electron transport layer on the first electrode layer; and a quantum dots layer on a side of the electron transport layer away from the first electrode layer; and wherein the electron transport layer comprises a gradient alloy composite sub-layer comprising an electron transport oxide material and an electron transport non-oxide chalcogen-containing material;

the electron transport non-oxide chalcogen-containing material comprising a non-oxide chalcogen;

the non-oxide chalcogen is selected from a group consisting of sulfide ion, selenium ion, and tellurium ion; and the electron transport non-oxide chalcogen-containing material has a gradient distribution such that a content of the electron transport non-oxide chalcogen-containing material decreases along a direction from the quantum dots layer to the first electrode layer.

* * * * *